(12) United States Patent
Tsao

(10) Patent No.: US 7,301,355 B1
(45) Date of Patent: Nov. 27, 2007

(54) MEMS PROBE CARD WITH ELASTIC MULTI-LAYER STRUCTURE

(75) Inventor: Yu-Cheng Tsao, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/558,792

(22) Filed: Nov. 10, 2006

(30) Foreign Application Priority Data

Dec. 30, 2005    (TW) ............................... 94147737 A

(51) Int. Cl.
*G01R 31/02* (2006.01)
(52) U.S. Cl. .................................................... 324/754
(58) Field of Classification Search ................ 324/754, 324/761, 762, 765, 158.1, 72.3
See application file for complete search history.

(56) References Cited

U.S. PATENT DOCUMENTS 6,084,420 A * 7/2000 Chee ........................... 324/754
6,651,325 B2 * 11/2003 Lee et al. ..................... 29/846
7,053,636 B2 * 5/2006 Sudin ......................... 324/754

\* cited by examiner

*Primary Examiner*—Ha Tran Nguyen
*Assistant Examiner*—Tung X. Nguyen

(57) ABSTRACT

An MEMS probe card with elastic multi-layer structure mainly includes a substrate and a plurality of MEMS probe assemblies. The MEMS probe assemblies are disposed on a plurality of testing pads of the substrate, and each of the MEMS probe assemblies includes a plurality of first layer bridge elements, a second layer bridge element and a probe tip. The first and the second layer bridge elements each forms a ⊓-shaped cross-section and has two piers and a beam. The piers of the second layer bridge elements are respectively disposed on the beams of the first layer elements, and the probe tips are disposed on the beams of the second layer bridge elements. According to the stacks formed by the second layer bridge elements disposing on the first layer bridge elements, the probe tips may have more elastic buffer and a better resistance to the compressive strain when probing the bumps or bonding pads on wafers.

18 Claims, 5 Drawing Sheets

MEMS PROBE CARD WITH ELASTIC MULTI-LAYER STRUCTURE

CROSS REFERENCE TO RELATED APPLICATION

This application claims the priority benefit of Taiwan Patent Application Serial Number 094147737, filed on Dec. 30, 2005, the full disclosure of which is incorporated herein by reference.

BACKGROUND OF THE INVENTION

1. Field of the Invention

This invention generally relates to an MEMS probe card, and more particularly to an MEMS probe card with multi-layer structure.

2. Description of the Related Art

Semiconductor devices have to be tested before packaging. A wafer is put in a testing machine with vertical probe tips, then utilizing the probe tips of a probe card to probe a plurality of bumps of input and output signal pads of the wafer. However, because the bumps disposed on the wafer have manufacturing variations, the heights of the bumps are different with each other, especially those bumps need to be reflowed to ball bumps will have larger variations in height. To ensure the probe tips to electrically contact the bumps effectively, the probe tips may be designed to have elasticity so as to improve the electrical coupling between the probe tips and the bumps.

FIG. 1 shows a conventional micro-electro-mechanical system (MEMS) probe card which is disclosed in U.S. Pat. No. 6,084,420. An MEMS probe assembly 120 is disposed on a testing pad 110, and the MEMS probe assembly 120 has a plurality of bridge elements 121, a plurality of supporting members 122 and a probe tip 123. The bridge elements 121 are laterally T-shaped and arranged in a single layer outward radiated structure, two sides of a head 121a of each bridge element 121 are respectively connected to the supporting members 122, tails 121b of the bridge elements 121 are connected together, and the probe tip 123 is disposed on the conjunction of the tails 121b of the bridge elements 121. According to the support to the probe tip 123 with the bridge elements 121 and the supporting members 122, the MEMS probe assembly 120 may have longitudinal elasticity. However, because the bridge elements 121 are arranged in single layer, they may have a limited elastic buffer. Moreover, the arrangement of the probe assembly with outward radiated structure may cause wasting of room and relatively decrease the counts of the MEMS probes assembly 120 on the probe card.

SUMMARY OF THE INVENTION

It is an object of the present invention to provide an MEMS probe card with elastic multi-layer structure. A substrate is disposed with a plurality of MEMS probe assemblies each having a plurality of first layer bridge elements, at least one second layer bridge element and a probe tip. The first layer bridge elements have a ⊓-shape cross-section and have two first piers and a first beam. The second layer bridge element has a ⊓-shaped cross-section and two of its piers are respectively disposed on the first beams of the first layer bridge elements. The probe tip is disposed on the second beam of the second layer bridge element. According to the stacking of the second layer bridge element on the first layer bridge elements, the probe tip may have more elastic buffer and a better resistance to compressive strain, and the counts of the MEMS probe assemblies may be increased.

It is an object of the present invention to provide an MEMS probe card with elastic multi-layer structure. The first and the second layer bridge elements are fabricated by electroplating with nickel, gold, copper, tungsten, titanium or their alloy, and the second layer bridge element is stacking on the first layer bridge elements and having an H-shaped vertical view with the first layer bridge elements such that the MEMS probe assemblies may have larger elasticity so as to probe the non-coplanar bumps or bonding pads on wafers.

According to the present invention, an MEMS probe card with elastic multi-layer structure mainly includes a substrate and a plurality of MEMS probe assemblies. The substrate has a plurality of testing pads, and the MEMS probe assemblies are disposed on the testing pads. Each of the MEMS probe assemblies includes a plurality of first layer bridge elements, at least one second layer bridge element and a probe tip, wherein each of the first layer bridge elements forms a ⊓-shaped cross-section and has two first piers and a first beam, the second layer bridge element forms a ⊓-shaped cross-section and has two second piers and a second beam, the second piers of the second layer bridge element are respectively disposed on the first beams of the first layer bridge elements, and the probe tip is disposed on the second beam of the second layer bridge element.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
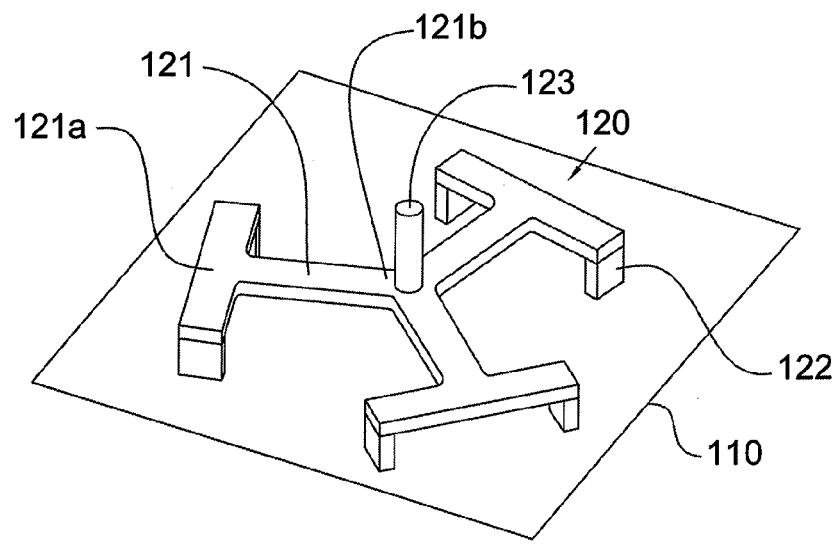
FIG. 1 shows an explored perspective view of a conventional MEMS probe assembly of a micro-electro-mechanical system (MEMS) probe card with elastic structure.
Figure 2:
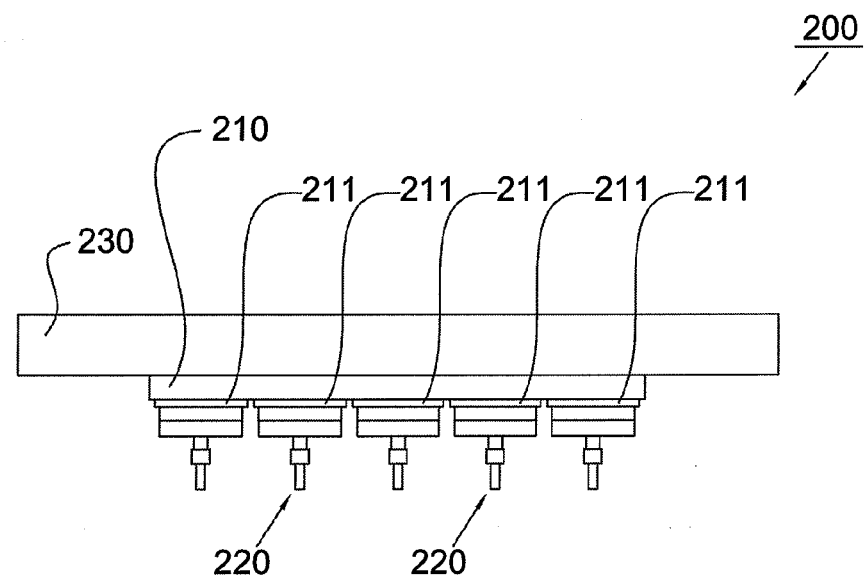
FIG. 2 shows a side view of the MEMS probe card with elastic multi-layer structure according to the first embodiment of the present invention.
Figure 3:
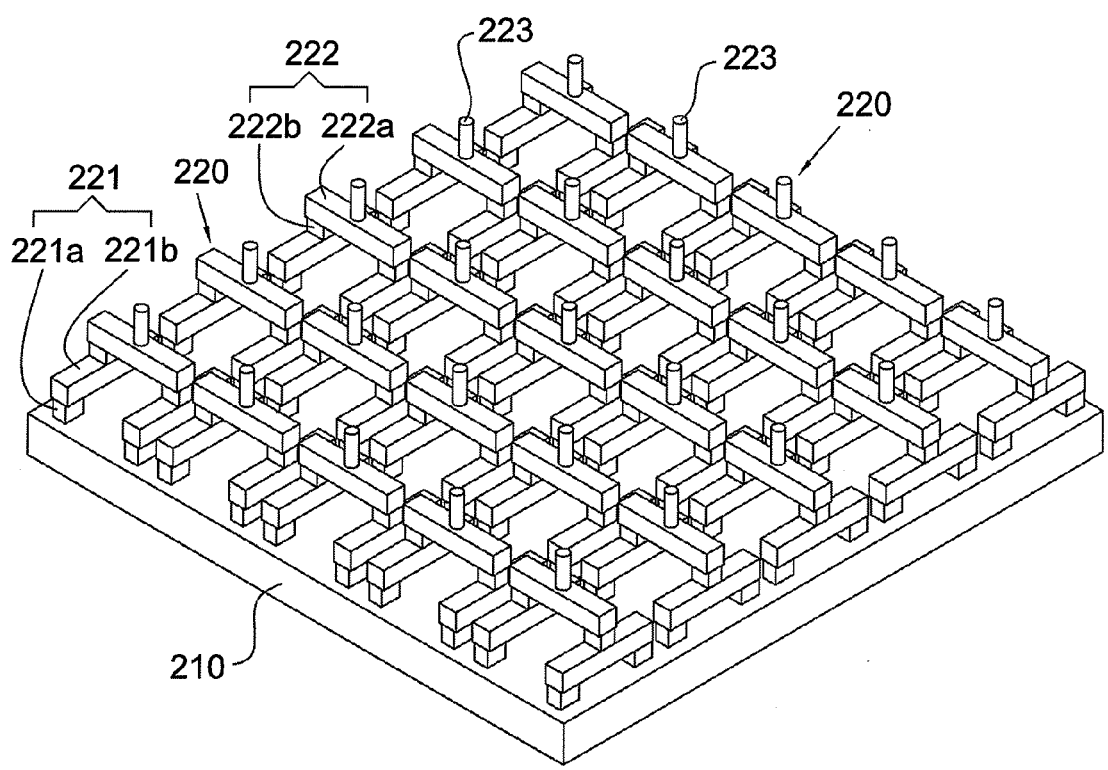
FIG. 3 shows an elevational view of the substrate of the MEMS probe card with elastic multi-layer structure according to the first embodiment of the present invention.
Figure 4:
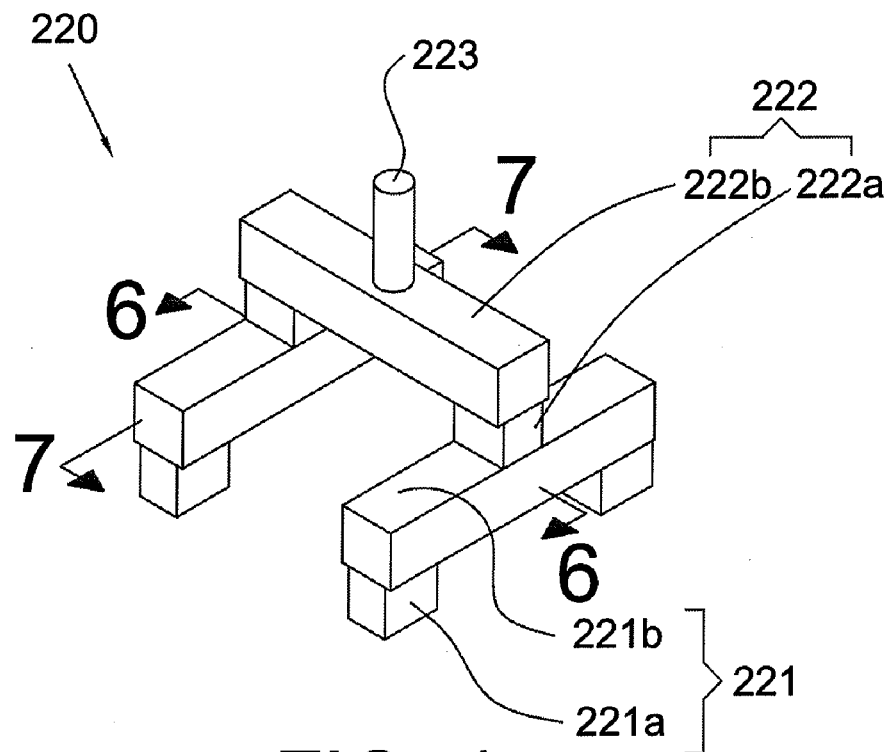
FIG. 4 shows an explored perspective view of the MEMS probe assembly of the MEMS probe card with elastic multi-layer structure according to the first embodiment of the present invention.
Figure 5:
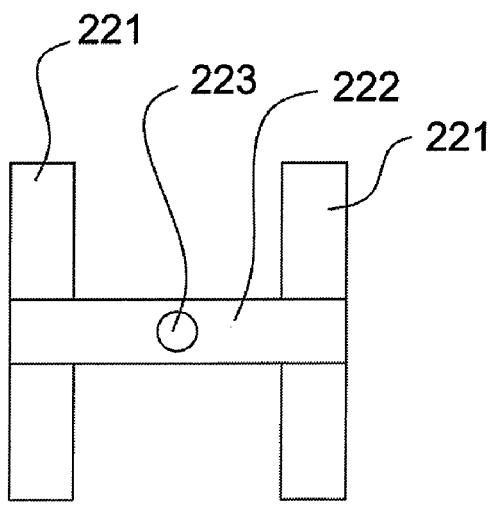
FIG. 5 shows an elevational view of the MEMS probe assembly of the MEMS probe card with elastic multi-layer structure according to the first embodiment of the present invention.
Figure 6:
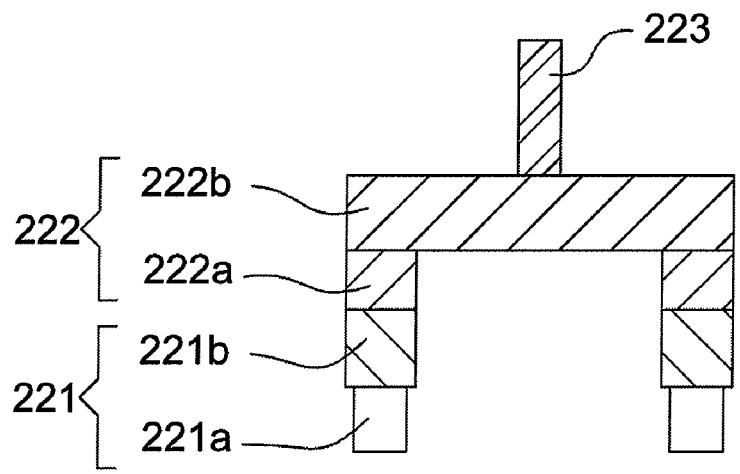
FIG. 6 shows a sectional view of FIG. 4 in the direction of 6-6 according to the first embodiment of the present invention.
Figure 7:
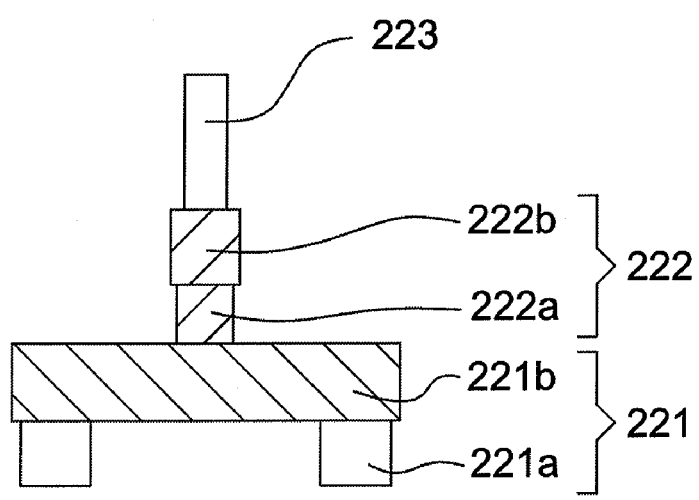
FIG. 7 shows a sectional view of FIG. 4 in the direction of 7-7 according to the first embodiment of the present invention.

Referring to FIGS. 2 and 3, in one embodiment of the present invention, a micro-electro-mechanical system (MEMS) probe card with elastic multi-layer structure 200 includes a substrate 210 and a plurality of MEMS probe assemblies 220. The substrate 210 has a plurality of testing pads 211, which can be a ceramic substrate or a silicon substrate so as to be used as a testing head of the MEMS probe card 200 and be disposed on a printed circuit boards 230. The MEMS probe assemblies 220 are disposed on the testing pads 211 corresponded to the position of a plurality of bumps on a wafer, and the MEMS probe assemblies 220 are advantageously arranged in matrix. Wherein, each of the MEMS probe assemblies 220 includes a plurality of first layer bridge elements 221, at least one second layer bridge element 22 and a probe tip 223. The first layer bridge elements 221 maybe formed of a material such as nickel, gold, copper, tungsten, titanium or their alloy, and which can be formed by the operating steps of first depositing a patterned photoresist layer on the substrate 210, and then proceeding lithography, electroplating and stripping photoresist. The material and the formation of the second layer bridge elements 222 may identical to that of the first layer bridge elements 221. The detailed descriptions of the MEMS probe assemblies 220 are referring to FIGS. 4, 5, 6 and 7. FIG. 4 shows an expanded perspective view of the MEMS probe assembly 220 according to the embodiment of the present invention. FIG. 6 shows a side view of FIG. 4 in the direction of 6-6, and FIG. 7 shows a side view of FIG. 4 in the direction of 7-7. The first layer bridge elements 221 are desirably arranged in parallel, each of the first layer bridge elements 221 forms a ⊓-shaped cross-section and has two first piers 221a and a first beam 221b, as shown in FIG. 2. The first piers 221a are disposed on the testing pads 221 of the substrate 210 and respectively connected to the two ends of the first beam 221b. Each of the second layer bridge elements 222 also forms a ⊓-shaped cross-section and has two second piers 222a and a second beam 222b, the second piers 222a are respectively disposed on the first beams 221b of the first layer bridge elements 221, as shown in FIG. 5. The second layer bridge elements 222 are stacking on the first layer bridge elements 221 and having an H-shaped vertical view with the first layer bridge elements 221. The probe tips 223 are disposed on the second beams 222b of the second layer bridge elements 222, and the material hardness of the probe tips 223 are larger than that of the first layer bridge elements 221 and the second layer bridge elements 222. The probe tips 223 can be fabricated by electroplating with tungsten or its alloy. According to the H-shaped assemblies formed by the second layer bridge elements 222 stacking on the first layer bridge elements 221, the probe tips 223 disposed on them may have larger elasticity such that the MEMS probe assemblies 220 of the MEMS probe card 200 may electrically coupling to the bumps or bonding pads on the wafer elastically so as to improve the testing difficulty caused by the coplanarity variations of the bumps or the bonding pads.

Figure 8:
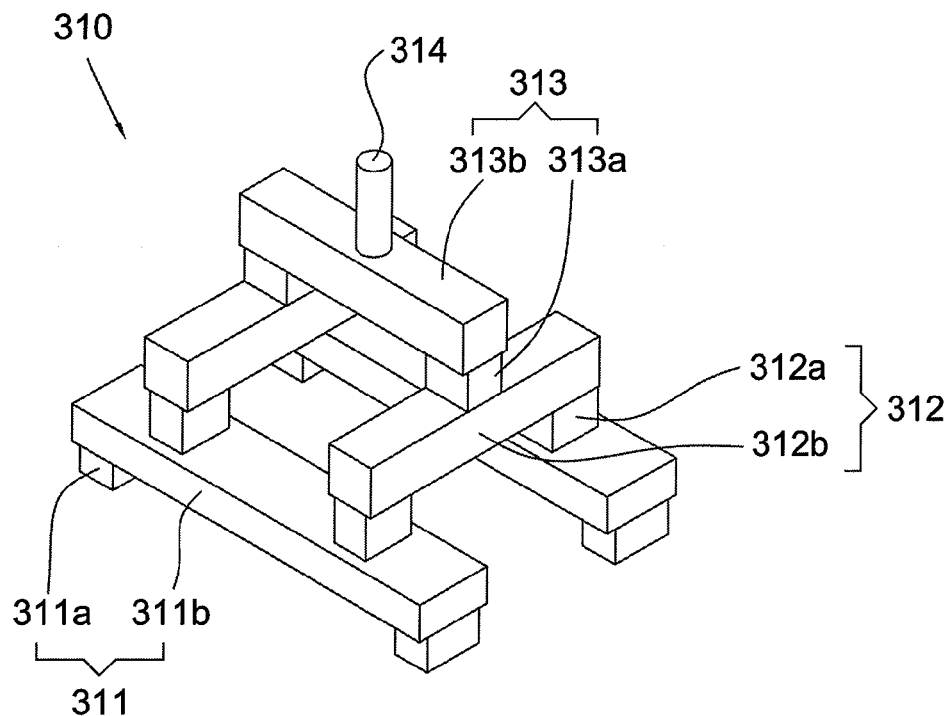
FIG. 8 shows an explored perspective view of the MEMS probe assembly of the MEMS probe card with elastic multi-layer structure according to the second embodiment of the present invention.
Figure 9:
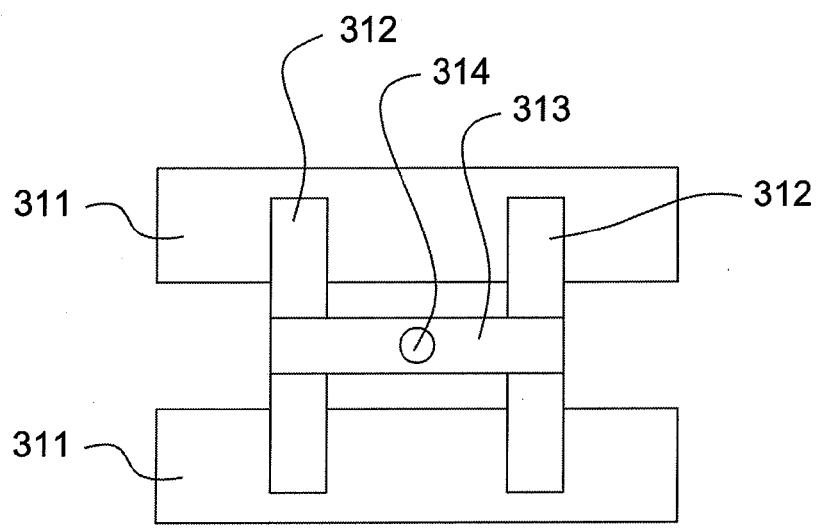
FIG. 9 shows an elevational view of the MEMS probe assembly of the MEMS probe card with elastic multi-layer structure according to the second embodiment of the present invention.

Referring to FIG. 8, in another embodiment of the present invention, an MEMS probe card with elastic multi-layer structure includes a substrate (not shown) and a plurality of MEMS probe assemblies 310, wherein each of the MEMS probe assemblies 310 includes a plurality of first layer bridge elements 311, a plurality of second layer bridge elements 312, a third layer bridge element 313 and a probe tip 314. The first layer bridge elements 311 are advantageously arranged in parallel, each of the first layer bridge elements 311 forms a ⊓-shaped cross-section and has two first piers 311a and a first beam 311b. The second layer bridge elements 312 are also desirably arranged in parallel and perpendicularly to the first layer bridge elements 311, each of the second layer bridge elements 312 forms a ⊓-shaped cross-section and has two second piers 312a and a second beam 312b. The second pier 312a of the second layer bridge elements are respectively disposed on the first beams 311b of the first layer bridge elements 311. The third layer bridge element 313 forms a ⊓-shaped cross-section and has two third piers 313a and a third beam 313b. The third piers 313a of the third layer bridge element 313 are respectively disposed on the second beams 312b of the second layer bridge elements 312. Preferably, the size of the first layer bridge elements 311 are larger than that of the second layer bridge elements 312 and the third layer bridge elements 313 such that the first layer bridge elements 311 may have better supporting ability. Referring to FIG. 9, in this embodiment, the second layer bridge elements 312 are stacking on the first layer bridge elements 311 and having a ∥-shaped vertical view with the first layer bridge elements 311, and the third layer bridge elements 313 are stacking on the second layer bridge elements 312 and having an H-shaped vertical view with the second layer bridge elements 312. The probe tips 314 are disposed on the third beams 313b of the third layer bridge elements 313. The first layer bridge elements 311, the second layer bridge elements 312, the third layer bridge elements 313 and the probe tips 314 can be formed by the operating steps of first depositing a multi-layer patterned photoresist procedure on each layer. The first layer bridge elements 311, the second layer bridge elements 312 and the third layer bridge elements 313 may be formed of a material such as nickel, gold, copper, tungsten, titanium or their alloy, and the probe tips 314 may be formed of a material such as tungsten or its alloy. In this embodiment, the arrangement of the three-layer bridge elements may increase the elasticity of the MEMS probe assemblies 310 so as to improve the testing difficulty caused by the coplanarity variations of the bumps or the bonding pads on the wafer, especially when the assembly is used to probe the bumps on a packaged wafer, e.g. bonding balls of a wafer level cheap scale package (WLCSP).

Although the invention has been explained in relation to its preferred embodiment, it is not used not limit the invention. It is to be understood that many other possible modifications and variations can be made by those skilled in the art without departing from the spirit and scope of the invention as hereinafter claimed.

What is claimed is:

1. An MEMS probe card with elastic multi-layer structure, comprising:
   a substrate having a plurality of testing pads; and
   a plurality of MEMS probe assemblies disposed on the testing pads, each of the MEMS probe assemblies comprising:
      a plurality of first layer bridge elements each having two first piers and a first beam;
      at least one second layer bridge element having two second piers and a second beam, the second piers being disposed respectively on the first beams of the first layer bridge elements; and
      a probe tip being disposed on the second beam of the second layer bridge element.

2. The MEMS probe card with elastic multi-layer structure as claimed in claim 1, further comprising a printed circuit board.

3. The MEMS probe card with elastic multi-layer structure as claimed in claim 1, wherein the material of the first and the second layer bridge elements is selected from the group of nickel, gold, copper, tungsten, titanium and their alloy.

4. The MEMS probe card with elastic multi-layer structure as claimed in claim 1, wherein the first and the second layer bridge elements are fabricated by electroplating.

5. The MEMS probe card with elastic multi-layer structure as claimed in claim 1, wherein the probe tips are fabricated by electroplating.

6. The MEMS probe card with elastic multi-layer structure as claimed in claim 1, wherein the second layer bridge elements are stacking on the first layer bridge elements and having an H-shaped vertical view with the first layer bridge elements.

7. The MEMS probe card with elastic multi-layer structure as claimed in claim 1, wherein the MEMS probe assemblies are arranged in matrix.

8. The MEMS probe card with elastic multi-layer structure as claimed in claim 1, wherein the first layer bridge elements are arranged in parallel.

9. The MEMS probe card with elastic multi-layer structure as claimed in claim 1, wherein the first and the second layer bridge elements both form a ⊓-shaped cross-section.

10. The MEMS probe card with elastic multi-layer structure as claimed in claim 1, each of the MEMS probe assemblies further comprising two third layer bridge elements each having two third piers and a third beam, wherein the first piers at the same one end of the first layer bridge elements are disposed on the third beam of one third layer bridge element and the first piers at the same other end of the first layer bridge elements are disposed on the third beam of the other third layer bridge element.

11. The MEMS probe card with elastic multi-layer structure as claimed in claim 10, further comprising a printed circuit board.

12. The MEMS probe card with elastic multi-layer structure as claimed in claim 10, wherein the material of the first layer bridge elements, the second layer bridge elements and the third layer bridge elements is selected from the group of nickel, gold, copper, tungsten, titanium and their alloy.

13. The MEMS probe card with elastic multi-layer structure as claimed in claim 10, wherein the first layer bridge elements, the second layer bridge elements and the third layer bridge elements are fabricated by electroplating.

14. The MEMS probe card with elastic multi-layer structure as claimed in claim 10, wherein the probe tips are fabricated by electroplating.

15. The MEMS probe card with elastic multi-layer structure as claimed in claim 10, wherein the first layer bridge elements are stacking on the third layer bridge elements and having a ‖-shaped vertical view with the third layer bridge elements; the second layer bridge elements are stacking on the first layer bridge elements and having an H-shaped vertical view with the first layer bridge elements.

16. The MEMS probe card with elastic multi-layer structure as claimed in claim 10, wherein the MEMS probe assemblies are arranged in matrix.

17. The MEMS probe card with elastic multi-layer structure as claimed in claim 10, wherein the third layer bridge elements are arranged in parallel, and the first layer bridge elements are arranged in parallel.

18. The MEMS probe card with elastic multi-layer structure as claimed in claim 10, wherein the first layer bridge elements, the second layer bridge elements and the third layer bridge elements all form a ⊓-shaped cross-section.

* * * * *